United States Patent
Chen

(10) Patent No.: US 11,984,179 B2
(45) Date of Patent: *May 14, 2024

(54) REDUNDANT CIRCUIT ASSIGNING METHOD AND DEVICE, AND MEDIUM

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 104 days.

This patent is subject to a terminal disclaimer.

(21) Appl. No.: 17/648,665

(22) Filed: Jan. 21, 2022

(65) Prior Publication Data

US 2022/0310187 A1    Sep. 29, 2022

Related U.S. Application Data

(63) Continuation of application No. PCT/CN2021/109464, filed on Jul. 30, 2021.

(30) Foreign Application Priority Data

Mar. 26, 2021    (CN) .......................... 202110327478.5

(51) Int. Cl.
| | |
|---|---|
| *G11C 29/38* | (2006.01) |
| *G11C 29/00* | (2006.01) |
| *G11C 29/44* | (2006.01) |

(52) U.S. Cl.
CPC .............. *G11C 29/38* (2013.01); *G11C 29/44* (2013.01); *G11C 29/4401* (2013.01); *G11C 29/76* (2013.01)

(58) Field of Classification Search
None
See application file for complete search history.

(56) References Cited

U.S. PATENT DOCUMENTS

| | | |
|---|---|---|
| 6,535,993 B1 | 3/2003 | Hamada |
| 6,741,509 B2 | 5/2004 | Kato |
| (Continued) | | |

FOREIGN PATENT DOCUMENTS

| | | |
|---|---|---|
| CN | 1195814 A | 10/1998 |
| CN | 1366308 A | 8/2002 |
| (Continued) | | |

OTHER PUBLICATIONS

International Search Report in the international application No. PCT/CN2021/099159, dated Sep. 8, 2021.

(Continued)

*Primary Examiner* — April Y Blair
*Assistant Examiner* — Matthew W Wahlin
(74) *Attorney, Agent, or Firm* — Syncoda LLC; Feng Ma

(57) ABSTRACT

A redundant circuit assigning method includes: executing a first test item to obtain first test data including position data of fail bits acquired during execution of the first test item; determining a first redundant circuit assigning result according to the first test data, where the first redundant circuit assigning result includes a number of assigned local redundant circuits and their corresponding position data; executing a second test item to obtain second test data including position data of fail bits acquired during execution of the second test item; and determining a second redundant circuit assigning result according to the first test data and the second test data, when the fail bits acquired during the execution of the second test item include one or more fail bits beyond a repair range of the assigned local redundant circuits and assigned global redundant circuits and when assignable local redundant circuits have been assigned.

14 Claims, 11 Drawing Sheets

(56) References Cited

U.S. PATENT DOCUMENTS

| | | | |
|---|---|---|---|
| 6,876,588 B2 | 4/2005 | Kato | |
| 7,079,432 B2 | 7/2006 | Kato | |
| 7,224,596 B2 | 5/2007 | Jeong | |
| 10,446,253 B2 | 10/2019 | Choi | |
| 2001/0009521 A1 | 7/2001 | Hidaka | |
| 2001/0026486 A1 | 10/2001 | Ogawa | |
| 2002/0001896 A1 | 1/2002 | Yoon | |
| 2002/0114198 A1 | 8/2002 | Kato | |
| 2002/0191454 A1 | 12/2002 | Beer | |
| 2003/0191991 A1 | 10/2003 | Hsu | |
| 2004/0062134 A1 | 4/2004 | Kato | |
| 2004/0210803 A1 | 10/2004 | Cheng | |
| 2005/0122802 A1 | 6/2005 | Kato | |
| 2006/0090058 A1 | 4/2006 | Chng | |
| 2006/0098503 A1 | 5/2006 | Jeong | |
| 2007/0247937 A1 | 10/2007 | Moriyama | |
| 2009/0119537 A1 | 5/2009 | Lee | |
| 2010/0157656 A1 | 6/2010 | Tsuchida | |
| 2010/0169705 A1 | 7/2010 | Fujii | |
| 2010/0322024 A1 | 12/2010 | Yagishita | |
| 2011/0002169 A1 | 1/2011 | Li | |
| 2011/0199845 A1 | 8/2011 | Yang | |
| 2012/0173932 A1 | 7/2012 | Li | |
| 2012/0206973 A1 | 8/2012 | He | |
| 2012/0257467 A1 | 10/2012 | Kosugi | |
| 2012/0275249 A1 | 11/2012 | Yang | |
| 2012/0297245 A1 | 11/2012 | Li | |
| 2013/0173970 A1 | 7/2013 | Kleveland | |
| 2014/0146613 A1 | 5/2014 | Yang et al. | |
| 2014/0219023 A1 | 8/2014 | Li et al. | |
| 2015/0066417 A1* | 3/2015 | Kimura | G06F 11/2294 |
| | | | 702/123 |
| 2015/0178614 A1 | 6/2015 | Lin | |
| 2015/0248322 A1 | 9/2015 | Hara et al. | |
| 2016/0005452 A1 | 1/2016 | Bae | |
| 2016/0351276 A1 | 12/2016 | Shim | |
| 2017/0110206 A1 | 4/2017 | Ryu et al. | |
| 2018/0182467 A1 | 6/2018 | Kang et al. | |
| 2019/0164621 A1 | 5/2019 | Kim | |
| 2019/0237154 A1 | 8/2019 | Choi | |
| 2019/0287641 A1 | 9/2019 | Ko | |
| 2019/0348100 A1 | 11/2019 | Smith et al. | |
| 2019/0348102 A1 | 11/2019 | Smith et al. | |
| 2020/0152285 A1 | 5/2020 | Nakaoka | |
| 2020/0243159 A1 | 7/2020 | Kang et al. | |
| 2022/0058079 A1 | 2/2022 | Chen | |
| 2022/0058080 A1 | 2/2022 | Chen | |
| 2022/0059182 A1 | 2/2022 | Chen | |
| 2022/0270668 A1 | 8/2022 | Li et al. | |
| 2022/0310187 A1 | 9/2022 | Chen | |
| 2022/0317908 A1 | 10/2022 | Chen | |

FOREIGN PATENT DOCUMENTS

| | | | |
|---|---|---|---|
| CN | 1404140 A | 3/2003 | |
| CN | 1409323 A | 4/2003 | |
| CN | 1467746 A | 1/2004 | |
| CN | 101329918 A | 12/2008 | |
| CN | 101331554 A | 12/2008 | |
| CN | 101630337 A | 1/2010 | |
| CN | 101765889 A | 6/2010 | |
| CN | 102157203 A | 8/2011 | |
| CN | 101765889 B | 12/2013 | |
| CN | 103473160 A | 12/2013 | |
| CN | 103688247 A | 3/2014 | |
| CN | 103871447 A | 6/2014 | |
| CN | 105787817 A | 7/2016 | |
| CN | 109753374 A | 5/2019 | |
| CN | 110010187 A | 7/2019 | |
| CN | 110364214 A | 10/2019 | |
| CN | 110797071 A | 2/2020 | |
| CN | 110797072 A | 2/2020 | |
| CN | 110879931 A | 3/2020 | |
| CN | 110968985 A | 4/2020 | |
| CN | 111312321 A | 6/2020 | |
| CN | 112216621 A | 1/2021 | |
| CN | 112885398 A | 6/2021 | |
| CN | 112908402 A | 6/2021 | |
| CN | 112908403 A | 6/2021 | |
| EP | 1217524 A2 | 6/2002 | |
| JP | 2000048596 A | 2/2000 | |
| JP | 2008084409 A | 4/2008 | |
| KR | 10-0795520 B1 * | 1/2008 | ............ G11C 29/00 |
| TW | 376558 B | 12/1999 | |
| TW | 470964 B | 1/2002 | |
| TW | 201110132 A | 3/2011 | |
| TW | 201642273 A | 12/2016 | |

OTHER PUBLICATIONS

International Search Report in the international application No. PCT/CN2021/099149, dated Sep. 7, 2021.
International Search Report in the international application No. PCT/CN2021/099146, dated Sep. 7, 2021.
International Search Report in the international application No. PCT/CN2021/099173, dated Aug. 26, 2021.
Supplementary European Search Report in the European application No. 21773439.1, dated Jun. 27, 2022.
English translation of the Written Opinion of the International Search Authority in the international application No. PCT/CN2021/099159, dated Sep. 8, 2021.
English translation of the Written Opinion of the International Search Authority in the international application No. PCT/CN2021/099149, dated Sep. 7, 2021.
First Office Action of the U.S. Appl. No. 17/464,886, dated Feb. 21, 2023.
First Office Action of the U.S. Appl. No. 17/462,042, dated Mar. 2, 2023.
English translation of the Written Opinion of the International Search Authority in the international application No. PCT/CN2021/099146, dated Sep. 7, 2021.
English translation of the Written Opinion of the International Search Authority in the international application No. PCT/CN2021/099173, dated Aug. 26, 2021.
First Office Action of the U.S. Appl. No. 17/445,300, dated Mar. 2, 2023.
International Search Report in the international application No. PCT/CN2021/109442, dated Jan. 4, 2022.
Notice of Allowance of the Chinese application No. 202110352509.2, dated Apr. 15, 2022.
International Search Report in the international application No. PCT/CN2021/109515, dated Dec. 30, 2021.
Notice of Allowance of the Chinese application No. 202110352499.2, dated Apr. 15, 2022.
First Office Action of the U.S. Appl. No. 17/515,776, dated Mar. 3, 2023.
International Search Report in the international application No. PCT/CN2021/109464, dated Dec. 30, 2021.
Notice of Allowance of the Chinese application No. 202110327478.5, dated Apr. 25, 2022.
Kristofik Stefan et al: "Enhancement of fault collection for embedded RAM redundancy analysis considering intersection and orphan faults", Integration, The VLSI Journal, North-Holland Publishing Company. Amsterdam, NL, vol. 62, Mar. 13, 2018 (Mar. 13, 2018), pp. 190-204, XP085401084.
Wey C-L et al: "On the Repair of Redundant RAM's", IEEE Transactions on Computer-Aided Design of Integrated Circuits and Systems, IEEE, USA, vol. CAD-06, No. 2, Mar. 1, 1987 (Mar. 1, 1987), pp. 222-231, XP000097484.
First Office Action of the European application No. 21773439.1, dated Feb. 24, 2023.
Non-Final Office Action of the U.S. Appl. No. 17/446,978, dated Aug. 21, 2023. 51 pages.
Notice of Allowance of the U.S. Appl. No. 17/445,300, dated Aug. 17, 2023. 65 pages.

* cited by examiner

REDUNDANT CIRCUIT ASSIGNING METHOD AND DEVICE, AND MEDIUM

CROSS-REFERENCE TO RELATED APPLICATIONS

This is a continuation of International Application No. PCT/CN2021/109464 filed on Jul. 30, 2021, which claims priority to Chinese Patent Application No. 202110327478.5 filed on Mar. 26, 2021. The disclosures of the above-referenced applications are hereby incorporated by reference in their entirety.

BACKGROUND

With the rapid development of semiconductor memory technology, market has placed higher demands on memory performance and reliability of semiconductor memory devices. The number and density of memory cells in semiconductor memory devices continue to increase, resulting in the continuous increase of the total number of fail bits in the semiconductor memory devices and the percentage relative to the total number of memory cells, which affects the memory performance and reliability of the semiconductor memory devices.

SUMMARY

The present disclosure relates to the field of semiconductors, and in particular to a redundant circuit assigning method and apparatus, a device, and a medium.

A first aspect of the present disclosure provides a redundant circuit assigning method, which includes the following operations. A first test item is executed to obtain first test data, where the first test data includes position data of fail bits acquired during execution of the first test item. A first redundant circuit assigning result is determined according to the first test data, where the first redundant circuit assigning result includes a number of assigned local redundant circuits and position data corresponding to the assigned local redundant circuits. A second test item is executed to obtain second test data, where the second test data includes position data of fail bits acquired during execution of the second test item. A second redundant circuit assigning result is determined according to the first test data and the second test data, when the fail bits acquired during the execution of the second test item include one or more fail bits beyond a repair range of the assigned local redundant circuits and assigned global redundant circuits, and the number of the assigned local redundant circuits is equal to a number of assignable local redundant circuits.

A second aspect of the disclosure provides a redundant circuit assigning device, including a memory storing processor-executable instructions and a processor. The processor is configured to execute the stored processor-executable instructions to perform operations including: executing a first test item to obtain first test data, where the first test data includes position data of fail bits acquired during execution of the first test item; determining a first redundant circuit assigning result according to the first test data, where the first redundant circuit assigning result includes a number of assigned local redundant circuits and position data corresponding to the assigned local redundant circuits; executing a second test item to obtain second test data, where the second test data includes position data of fail bits acquired during execution of the second test item; and determining a second redundant circuit assigning result according to the first test data and the second test data, when the fail bits acquired during the execution of the second test item include one or more fail bits beyond a repair range of the assigned local redundant circuits and assigned global redundant circuits, and when the number of assigned local redundant circuits is equal to a number of assignable local redundant circuits.

A third aspect of the disclosure provides a non-transitory computer-readable storage medium having stored thereon computer-executable instructions that, when executed by a processor, cause the processor to perform operations including: executing a first test item to obtain first test data, where the first test data includes position data of fail bits acquired during execution of the first test item; determining a first redundant circuit assigning result according to the first test data, where the first redundant circuit assigning result includes a number of assigned local redundant circuits and position data corresponding to the assigned local redundant circuits; executing a second test item to obtain second test data, where the second test data includes position data of fail bits acquired during execution of the second test item; and determining a second redundant circuit assigning result according to the first test data and the second test data, when the fail bits acquired during the execution of the second test item include one or more fail bits beyond a repair range of the assigned local redundant circuits and assigned global redundant circuits, and when the number of assigned local redundant circuits is equal to a number of assignable local redundant circuits.

BRIEF DESCRIPTION OF THE DRAWINGS

In order to more clearly describe the technical solutions of the embodiments in the present disclosure, the following will briefly introduce the drawings used in the description of the embodiments. Obviously, the drawings in the following description are merely some embodiments in the present disclosure, and the drawings of other embodiments may also be obtained based on these drawings without creative effort by those skilled in the art.

DETAILED DESCRIPTION

Figure 1:
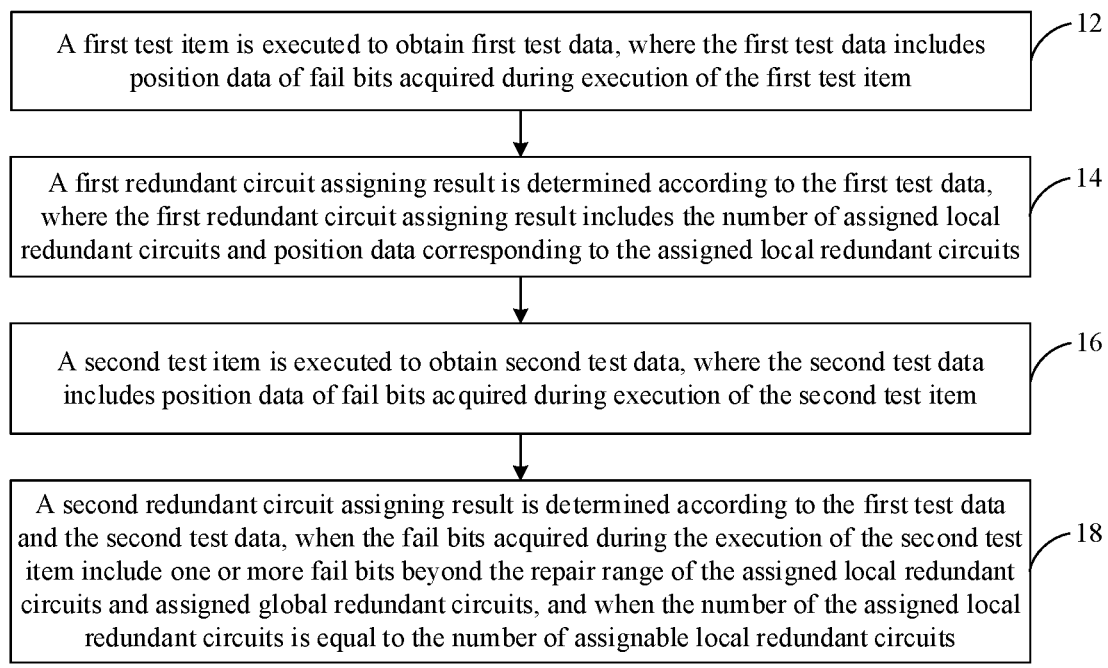
FIG. 1 is a schematic flowchart of a redundant circuit assigning method according to a first embodiment of the present disclosure.

In order to facilitate the understanding of the present disclosure, the following will make a more comprehensive description of the present disclosure with reference to the relevant drawings. The preferred embodiments of the present disclosure are shown in the accompanying drawings. However, the present disclosure can be implemented in many different forms and is not limited to the embodiments described herein. On the contrary, the objective of providing these embodiments is to make the understanding of the disclosure of the present disclosure more thorough and comprehensive.

Unless otherwise defined, all technical and scientific terms used herein have the same meaning as commonly understood by those skilled in the art of the present disclosure. The terms used in the specification of the present disclosure herein is not intended to limit the present disclosure, but is only for the objective of describing specific embodiments. In the case of using the "including", "having", and "containing" described in this article, unless a clear qualifying term is used, such as "only", "consisting of", etc., another component may be added. Unless mentioned to the contrary, terms in the singular form may include the plural form, and it cannot be understood that the number is one.

It should be understood that although the terms "first", "second", etc. may be used herein to describe various elements, these elements should not be limited by these terms. These terms are only used to distinguish one element from another element. For example, without departing from the scope of the present disclosure, the first element may be referred to as the second element, and similarly, the second element may be referred to as the first element.

A preset number of redundant circuits can be additionally arranged in a storage array area of the semiconductor memory device in advance, address lines with fail bits are exchanged through the redundant circuit, the semiconductor memory device with fail bits is repaired, thereby effectively improving the memory performance and reliability of the semiconductor memory device.

The inventor(s) of the present disclosure have recognized that, when the number of available redundant circuits in the semiconductor memory device is known, how to determine a redundant circuit assigning repair scheme and improve the utilization efficiency of the redundant circuit on the premise of ensuring that all of the fail bits can be repaired has become one of the technical problems to be solved in the process of further improving the memory performance and reliability of the semiconductor memory device.

The invention motivation and implementation principle of the present disclosure are illustrated by taking the example of assigning redundant circuits to a Dynamic Random-Access Memory (DRAM) chip so as to repair fail bits therein. The operation of assigning redundant circuits to the DRAM chip to repair the fail bits generally includes the following two types.

(1) Single Assignment Repair Scheme

Before fusing assigned redundant circuits to repair the fail bits within the repair range thereof, position data of the fail bits is acquired by running a preset test item once, and the redundant circuits are assigned according to the acquired position data of the fail bits. The position data of all fail bits can be obtained only after all test items are executed, after the position data of the fail bits is acquired, the redundant circuits are assigned to the fail bits whose position data is known, the repair action is performed, and it is determined whether the chip with quality defect cannot be found in time due to the fact that the number of the fail bits of the tested chip is too large, the assignable redundant circuits have been used up and the fail bits are not repaired. In addition, all test items have been executed before the defective chips are detected, which wastes a lot of test time and cannot avoid the occurrence of defective chips.

(2) Multiple Discontinuous Assignment Repair Scheme

After the position data of the fail bits is acquired by running the preset test item each time, the redundant circuits are assigned according to the acquired position data of the fail bits without executing the repair action; furthermore, the preset test item inherits the redundant circuit assigning result corresponding to the previous test result in each time of running; and after the preset test items are operated for multiple times and the position data of all the fail bits is acquired, the repair action is executed according to the redundant circuit assigning result corresponding to the last test result. Therefore, on the premise that it is determined that all the fail bits in the tested chip can be repaired by the assignable redundant circuits, the repair action is executed according to the redundant circuit assigning result corresponding to the last test result, so that the efficiency of test repair of the chip is effectively improved, and the chip with quality defect and waste of repair resources for the chip with quality defect are avoided. However, in the multi discontinuous assignment repair scheme, the redundant circuit assigning results corresponding to the multiple test results are made without acquisition of the position data of all fail bits, then a situation that the fail bits are not covered by the repair range of the actually assigned redundant circuits is likely to occur under the condition that all the fail bits can be really and completely repaired, so that the yield of the semiconductor memory chip is reduced; and in addition, a situation that the same fail bit is repeatedly repaired by different types of redundant circuits easily occurs, and thus the repair cost is increased.

Therefore, the present disclosure aims to provide a redundant circuit assigning method, which improves the utilization efficiency of the redundant circuit, avoids repeated repair, and improves the yield of the semiconductor memory chip while reducing the repair cost on the premise of ensuring that all fail bits can be repaired.

Referring to FIG. 1, in an embodiment of the present disclosure, a redundant circuit assigning method is provided, which includes the following operations illustrated in blocks 12-18.

In block 12, a first test item is executed to obtain first test data, where the first test data includes position data of fail bits acquired during execution of the first test item.

In block 14, a first redundant circuit assigning result is determined according to the first test data, where the first redundant circuit assigning result includes the number of assigned local redundant circuits and position data corresponding to the assigned local redundant circuits.

In block 16, a second test item is executed to obtain second test data, where the second test data includes position data of fail bits acquired during execution of the second test item.

In block 18, a second redundant circuit assigning result is determined according to the first test data and the second test data, when the fail bits acquired during the execution of the second test item include one or more fail bits beyond the repair range of the assigned local redundant circuits and assigned global redundant circuits, and when the number of the assigned local redundant circuits is equal to the number of assignable local redundant circuits.

As an example, with further reference to FIG. 1, in the case where the number of assignable local redundant circuits and the number of assignable global redundant circuits are known, a first test item is executed to obtain first test data. The first test data includes the position data of the fail bits acquired during the execution of the first test item. A first redundant circuit assigning result is determined according to the first test data, where the first redundant circuit assigning result includes the number of assigned local redundant circuits and the corresponding position data. A second test item is executed to obtain second test data, where the second test data includes the position data of the fail bits acquired during the execution of the second test item. A second redundant circuit assigning result is determined according to the first test data and the second test data, when the fail bits acquired during the execution of the second test item includes one or more fail bits beyond the repair range of the assigned local redundant circuits and the assigned global redundant circuits, and when the number of assigned local redundant circuits is equal to the number of assignable local redundant circuits. In this way, on the premise of ensuring that all the fail bits can be repaired by the assigned local redundant circuits and the assigned global redundant circuits, the sum of the number of assigned local redundant circuits and the number of assigned global redundant circuits can be reduced as much as possible, thereby avoiding repeated repairs and improving the utilization efficiency of redundant circuits.

Figure 2:
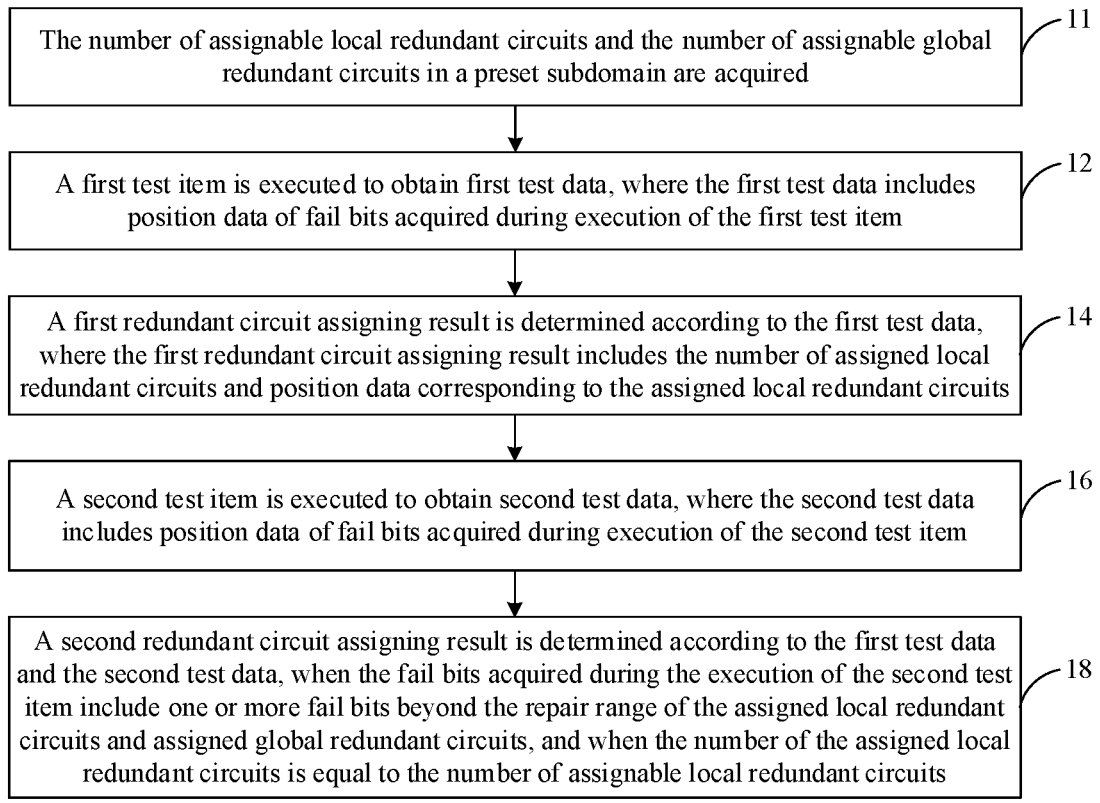
FIG. 2 is a schematic flowchart of a redundant circuit assigning method according to a second embodiment of the present disclosure.

Furthermore, referring to FIG. 2, in an embodiment of the present disclosure, before the operation of executing the first test item to obtain the first test data, the redundant circuit assigning method further includes the following operation illustrated in block 11.

In block 11, the number of assignable local redundant circuits and the number of assignable global redundant circuits in a preset subdomain are acquired.

By acquiring the number of assignable local redundant circuits and the number of assignable global redundant circuits in the preset subdomain, a preferable redundant circuit assigning scheme is determined according to the number of assignable local redundant circuits and the number of assignable global redundant circuits. In this way, on the premise of ensuring that all of the fail bits can be repaired by the assigned local redundant circuits and the assigned global redundant circuits, the sum of the number of assigned local redundant circuits and the number of assigned global redundant circuits can be reduced as much as possible, thereby avoiding repeated repairs and improving the utilization efficiency of redundant circuits.

As an example, in an embodiment of the present disclosure, an extension direction of the local redundant circuit is consistent with an extension direction of a bit line, and an extension direction of the global redundant circuit is consistent with an extension direction of a word line, so that the local redundant circuit can repair the fail bit in the row direction of a memory cell array, and the global redundant circuit can repair the fail bit in the column direction of the memory cell array.

Figure 3:
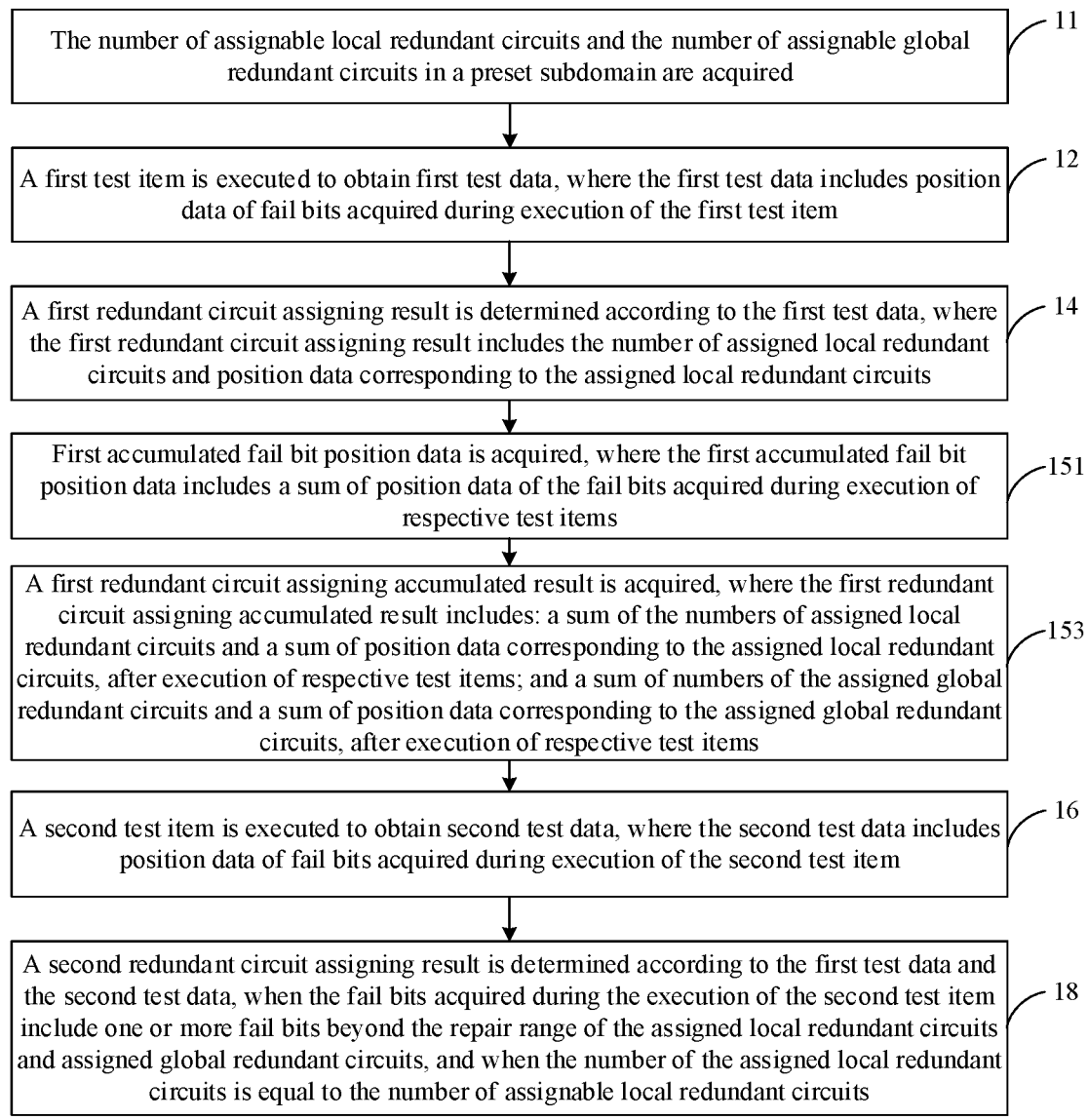
FIG. 3 is a schematic flowchart of a redundant circuit assigning method according to a third embodiment of the present disclosure.

Moreover, referring to FIG. 3, in an embodiment of the present disclosure, after the operation of determining a first redundant circuit assigning result according to the first test data and before the operation of executing the second test item to obtain the second test data, the redundant circuit assigning method may further include the following operations illustrated in blocks 151 and 153.

In block 151, first accumulated fail bit position data is acquired, where the first accumulated fail bit position data includes a sum of position data of the fail bits acquired during execution of respective test items.

In block 153, a first redundant circuit assigning accumulated result is acquired, where the first redundant circuit assigning accumulated result includes: a sum of the numbers of assigned local redundant circuits and a sum of position data corresponding to the assigned local redundant circuits, after execution of respective test items; and a sum of numbers of the assigned global redundant circuits and a sum of position data corresponding to the assigned global redundant circuits, after execution of respective test items.

As an example, with further reference to FIG. 3, by acquiring the first accumulated fail bit position data that includes the sum of position data of fail bits acquired during execution of respective test items, repeated test for the fail bits with known position data is no longer performed during execution of the second test item, so that the execution efficiency of the test item is improved, and the position data of all fail bits is detected as much as possible. By acquiring the first redundant circuit assigning accumulated result, after each executed test item, it is determined whether the repair range of the assigned global redundant circuits and the assigned local redundant circuits can cover all fail bits with known position data, and it is determined whether the redundant circuit assigning scheme can be further optimized, where the first redundant circuit assigning accumulated result includes: a sum of the numbers of assigned local redundant circuits and a sum of position data of the assigned local redundant circuits, after execution of respective test items; and a sum of numbers of the assigned global redundant circuits and a sum of position data of the assigned global redundant circuits, after execution of respective test items. Therefore, on the premise of avoiding missing repair or repeated repair of the fail bits, the number of the assigned local redundant circuits and the number of the assigned global redundant circuits are reduced as much as possible.

As an example, in an embodiment of the present disclosure, after the operation of determining the first redundant circuit assigning result according to the first test data and before the operation of executing the second test item to obtain the second test data, the redundant circuit assigning method further includes the following operations illustrated in blocks 1521 and 1522.

In block 1521, a name of the first test item is acquired.

In block 1522, a first accumulated fail bit position result is generated, and the first accumulated fail bit position result includes the name of the first test item and the first accumulated fail bit position data.

Specifically, the (m−1)-th accumulated fail bit position result can be generated according to the acquired name of the (m−1)-th test item. The (m−1)-th accumulated fail bit position result includes the name of the (m−1)-th test item and the (m−1)-th accumulated fail bit position data, so as to obtain the m-th accumulated fail bit position data. The m-th accumulated fail bit position data is the sum of the (m−1)-th accumulated fail bit position data and the fail bit position data obtained during execution of the m-th test item. The m-th redundant circuit assigning accumulated result is obtained. The m-th redundant circuit assigning accumulated result is the sum of the (m−1)-th redundant circuit assigning accumulated result and the m-th redundant circuit assigning result, where m is the number of the test items to be executed, and m is an integer larger than or equal to 2. Therefore, whether the repair range of the assigned redundant circuits completely covers all fail bits with the known position data is determined according to the m-th redundant circuit assigning accumulated result. The assigned redundant circuits can include global redundant circuits and local redundant circuits, an extension direction of the local redundant circuits is consistent with an extension direction of bit lines, and an extension direction of the global redundant circuits is consistent with an extension direction of word lines.

Figure 4:
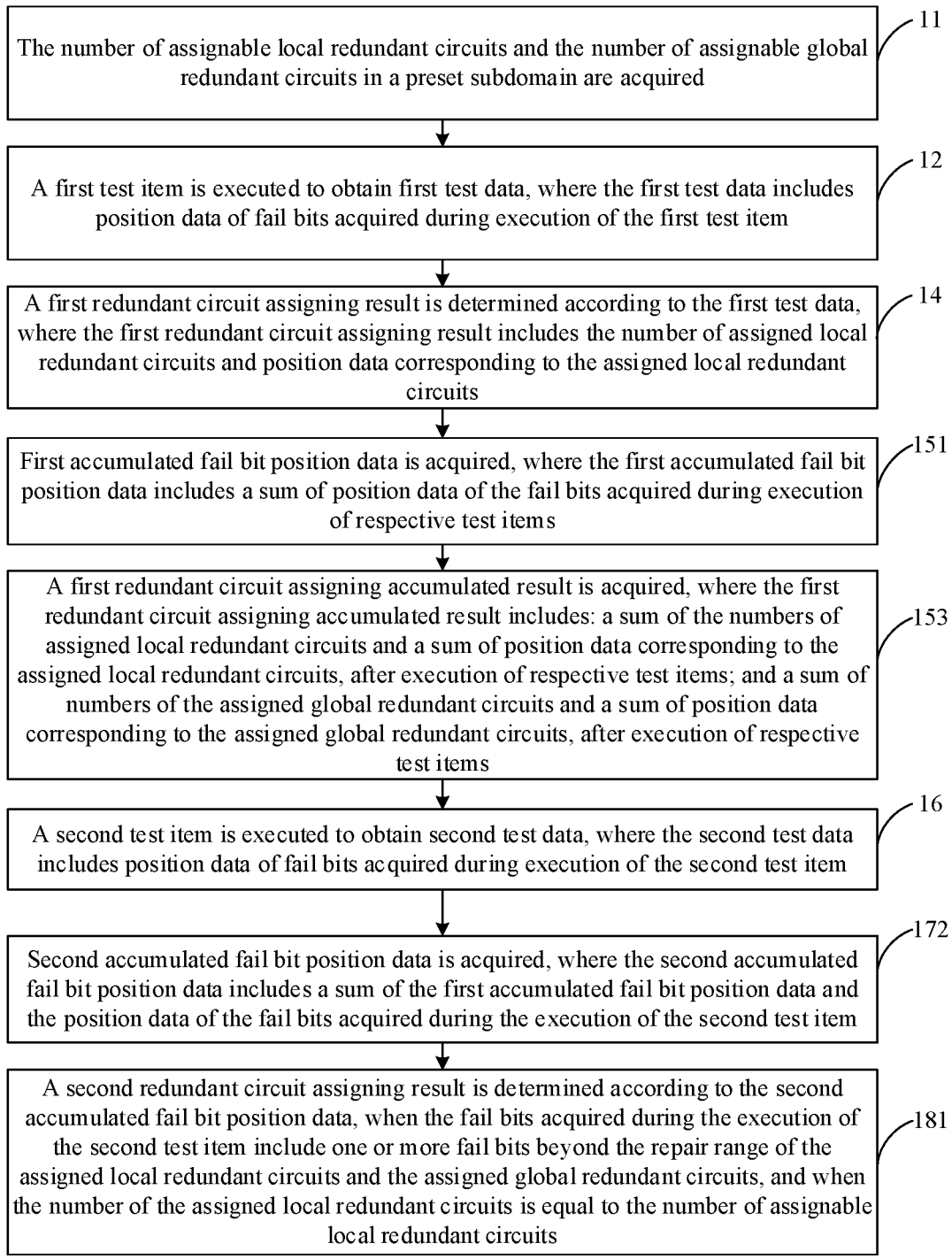
FIG. 4 is a schematic flowchart of a redundant circuit assigning method according to a fourth embodiment of the present disclosure.

Furthermore, referring to FIG. 4, in an embodiment of the present disclosure, a redundant circuit assigning method is provided, which includes the following operations.

In block 11, a number of assignable local redundant circuits and a number of assignable global redundant circuits in a preset subdomain are acquired.

In block 12, a first test item is executed to obtain first test data, where the first test data includes position data of fail bits acquired during execution of the first test item.

In block 14, a first redundant circuit assigning result is determined according to the first test data, where the first redundant circuit assigning result includes the number of assigned local redundant circuits and position data corresponding to the assigned local redundant circuits.

In block 151, first accumulated fail bit position data is acquired, where the first accumulated fail bit position data includes a sum of position data of the fail bits acquired during execution of respective test items.

In block 153, a first redundant circuit assigning accumulated result is acquired, where the first redundant circuit assigning accumulated result includes: a sum of the numbers of assigned local redundant circuits and a sum of position data corresponding to the assigned local redundant circuits, after execution of respective test items; and a sum of numbers of the assigned global redundant circuits and a sum of position data corresponding to the assigned global redundant circuits, after execution of respective test items.

In block 16, a second test item is executed to obtain second test data, where the second test data includes position data of fail bits acquired during execution of the second test item.

In block 172, second accumulated fail bit position data is acquired, where the second accumulated fail bit position data includes a sum of the first accumulated fail bit position data and the position data of the fail bits acquired during the execution of the second test item.

In block 181, a second redundant circuit assigning result is determined according to the second accumulated fail bit position data, when the fail bits acquired during the execution of the second test item include one or more fail bits beyond the repair range of the assigned local redundant circuits and the assigned global redundant circuits, and when the number of the assigned local redundant circuits is equal to the number of assignable local redundant circuits.

Specifically, after executing the second test item to obtain the second test data, where the second test data includes the position data of the fail bits acquired during the execution of the second test item, the second accumulated fail bit position data is acquired. The second accumulated fail bit position data includes the sum of the first accumulated fail bit position data and the position data of the fail bits acquired during the execution of the second test item. A second redundant circuit assigning result is determined according to the second accumulated fail bit position data, when the fail bits acquired during the execution of the second test item include one or more fail bits beyond the repair range of the assigned local redundant circuits and the assigned global redundant circuits, and when the number of the assigned local redundant circuits is equal to the number of assignable local redundant circuits. That is, after all of the test items are executed, the sum of the position data of the fail bits acquired during the execution of each of the test items can be acquired, and the redundant circuit assigning result can be determined according to the acquired position data of all the fail bits, so as to execute the repair action according to the redundant circuit assigning result. In this way, on the premise of ensuring that all of the fail bits can be repaired by the assigned local redundant circuits and the assigned global redundant circuits, the sum of the number of the assigned local redundant circuits and the number of the assigned global redundant circuits can be reduced as much as possible, thereby avoiding repeated repairs and improving the utilization efficiency of redundant circuits.

As an example, in an embodiment of the present disclosure, after the operation of executing the second test item to obtain the second test data, the method further includes the following operations illustrated in blocks 1711 and 1712.

In block 1711, a name of the second test item is acquired.

In block 1712, a second accumulated fail bit position result is generated, where the second accumulated fail bit position result includes the name of the second test item and second accumulated fail bit position data.

Specifically, the m-th accumulated fail bit position result can be generated according to the acquired name of the m-th test item. The m-th accumulated fail bit position result includes the name of the m-th test item and the m-th accumulated fail bit position data, so as to generate an m-th accumulated fail bit position result file according to the m-th accumulated fail bit position result. The m-th accumulated fail bit position result file includes the (m−1)-th accumulated fail bit position result and the m-th accumulated fail bit position result. Where m is the number of test items to be executed and is an integer greater than or equal to 2. Therefore, whether the repair range of the assigned redundant circuits completely covers all fail bits with the known position data is determined according to the m-th redundant circuit assigning accumulated result. The assigned redundant circuits can include global redundant circuits and local redundant circuits, an extension direction of the local redundant circuits is consistent with an extension direction of bit lines, and an extension direction of the global redundant circuits is consistent with an extension direction of word lines.

Figure 5:
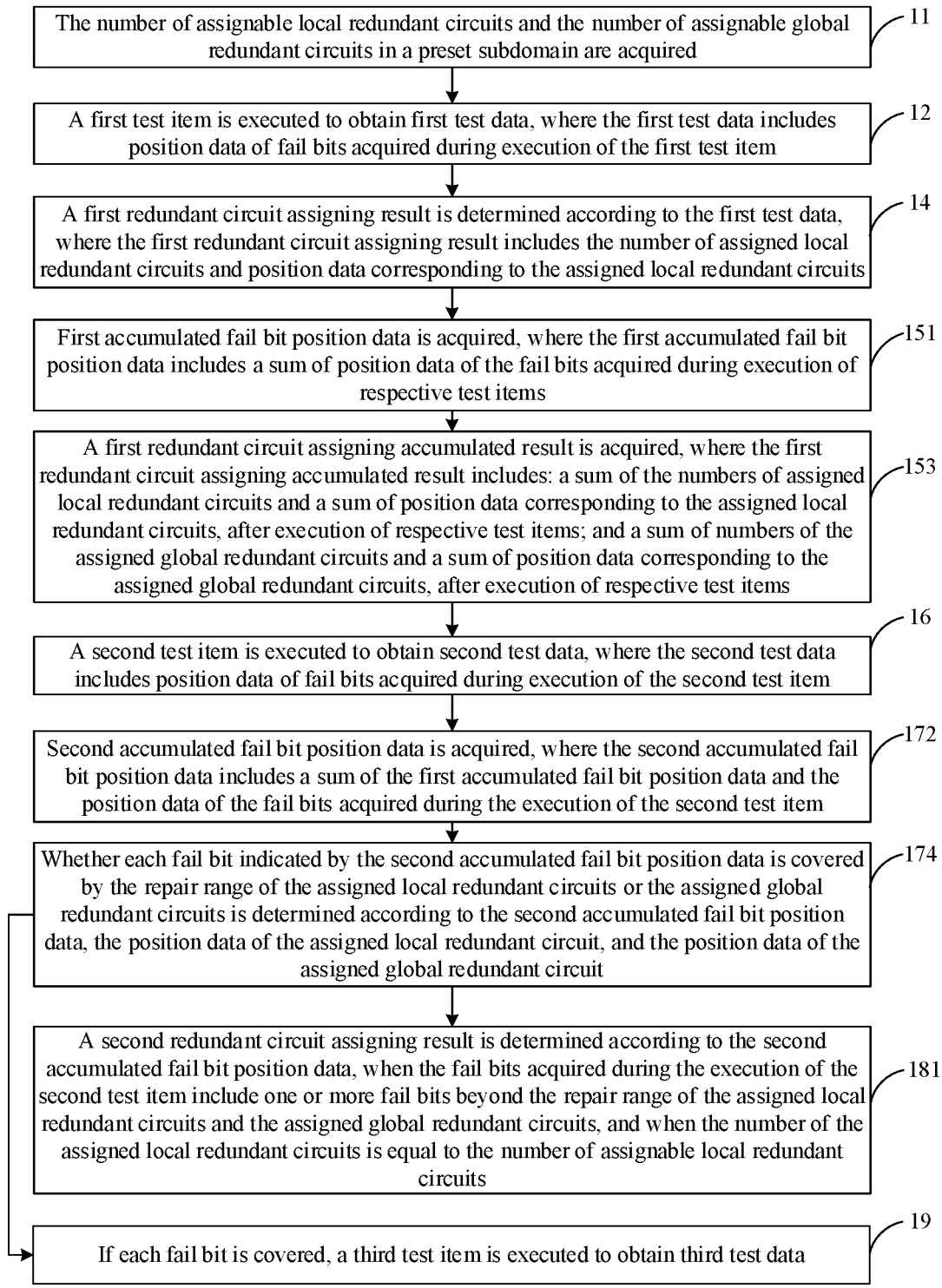
FIG. 5 is a schematic flowchart of a redundant circuit assigning method according to a fifth embodiment of the present disclosure.

Furthermore, referring to FIG. 5, in an embodiment of the present disclosure, after the operation of executing the second test item to obtain the second test data, the method further includes the following operations illustrated in blocks 174 and 19.

In block 174, whether each fail bit indicated by the second accumulated fail bit position data is covered by the repair range of the assigned local redundant circuits or the assigned global redundant circuits is determined according to the second accumulated fail bit position data, the position data of the assigned local redundant circuit, and the position data of the assigned global redundant circuit.

In block 19, if each fail bit is covered, a third test item is executed to obtain third test data.

Since the acquired position data of all the fail bits are covered by the repair range of the assigned local redundant circuits or the assigned global redundant circuits, the repair action can be executed according to the redundant circuit assigning result, so that each fail bit indicated by the second accumulated fail bit position data is covered by the repair range of the assigned local redundant circuits or the assigned global redundant circuits, so as to effectively improve the yield of the semiconductor memory chip. Since the redundant circuit assigning result is determined according to all fail bits with known position data, the sum of the number of the assigned local redundant circuits and the number of the assigned global redundant circuits can be reduced as much as possible on the premise of ensuring that all of the fail bits can be repaired by the assigned local redundant circuits and the assigned global redundant circuits, thereby avoiding repeated repairs and improving the utilization efficiency of redundant circuits.

Figure 6:
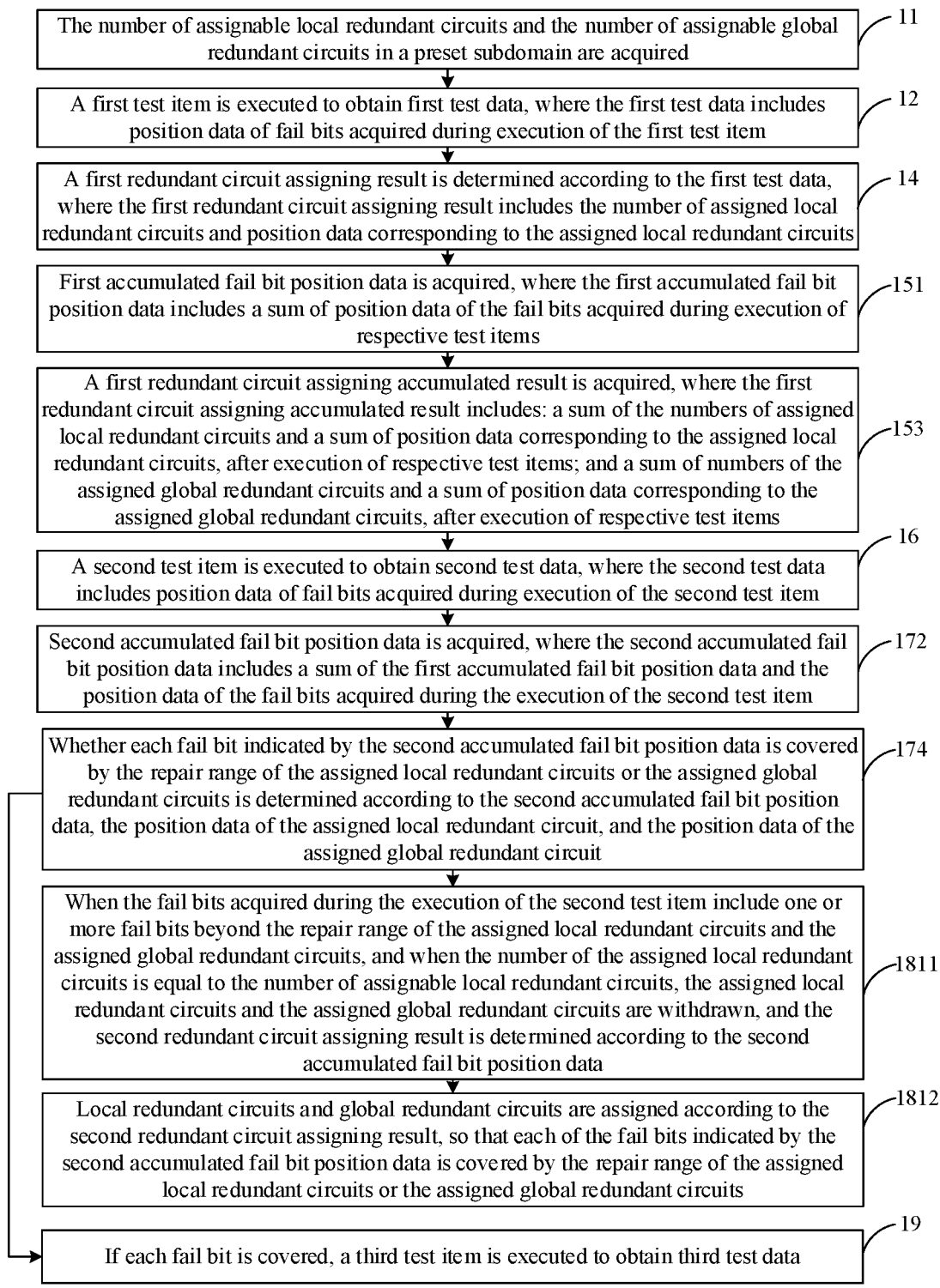
FIG. 6 is a schematic flowchart of a redundant circuit assigning method according to a sixth embodiment of the present disclosure.

Furthermore, referring to FIG. 6, in an embodiment of the present disclosure, the operation of determining the second redundant circuit assigning result according to the first test data and the second test data further includes the following operations illustrated in blocks 1811 and 1812.

In block 1811, when the fail bits acquired during the execution of the second test item include one or more fail bits beyond the repair range of the assigned local redundant circuits and the assigned global redundant circuits, and when the number of the assigned local redundant circuits is equal to the number of assignable local redundant circuits, the assigned local redundant circuits and the assigned global redundant circuits are withdrawn, and the second redundant circuit assigning result is determined according to the second accumulated fail bit position data.

In block 1812, the local redundant circuits and the global redundant circuits are assigned according to the second redundant circuit assigning result, so that each of the fail bits indicated by the second accumulated fail bit position data is covered by the repair range of the assigned local redundant circuits or the assigned global redundant circuits.

If it is detected that the fail bits with the known position data are located beyond the repair range coverage of the assigned local redundant circuits or the assigned global redundant circuits, the assigned local redundant circuits and the assigned global redundant circuits will be withdrawn, and the second redundant circuit assigning result is determined according to the second accumulated fail bit position data, so as to assign the local redundant circuits and the global redundant circuits according to the second redundant circuit assigning result, so that each of the fail bits indicated by the second accumulated fail bit position data is covered by the repair range of the assigned local redundant circuits or the assigned global redundant circuits. Therefore, the number of assigned local redundant circuits and the number of assigned global redundant circuits can be reduced as much as possible on the premise of avoiding missing or repeated repair of the fail bits.

Figure 7A:
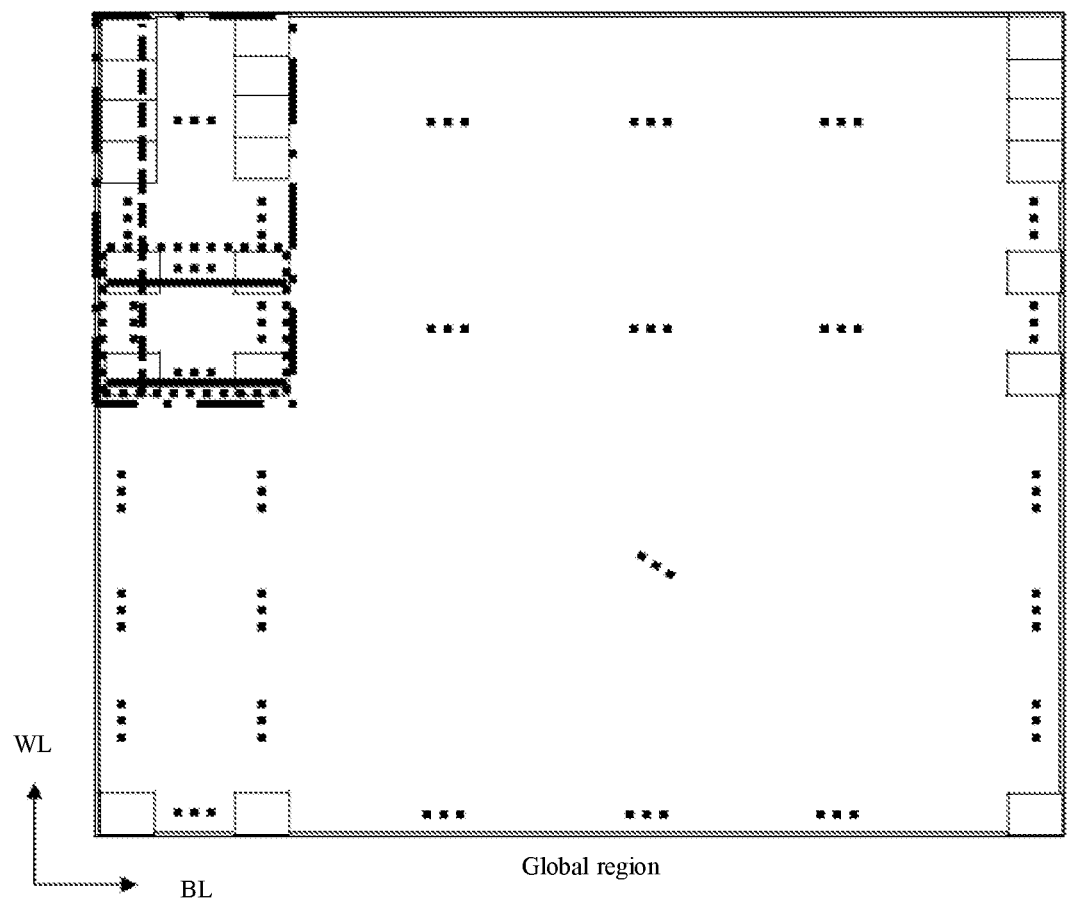
FIG. 7A is a first schematic diagram illustrating division of a memory cell array bank of a memory according to an embodiment of the present disclosure.
Figure 7B:
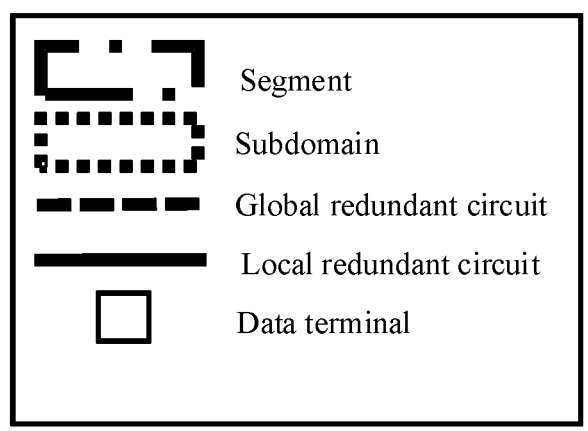
FIG. 7B is a second schematic diagram illustrating division of a memory cell array bank of a memory according to an embodiment of the present disclosure.

As an example, referring to FIGS. 7A and 7B, in an embodiment of the present disclosure, before the operation of acquiring the number of assignable local redundant circuits and the number of assignable global redundant circuits in the preset subdomain, the method further includes the following operations. A memory cell array bank of a memory is divided into multiple global regions; any one of the global regions is divided into multiple segments; and any one of the segments is divided into multiple subdomains. The assignable global redundant circuits in any segment are not crossed with the assignable global redundant circuits in other segments in the same global region, and the assignable local redundant circuits in any subdomain are not crossed with the assignable local redundant circuits in other subdomains in the same segment.

The memory cell array bank of the memory is divided into multiple global regions as shown in FIG. 7A, and then with reference to the segment range, the subdomain range, the global redundant circuit coverage range, and the local redundant circuit coverage range illustrated in FIG. 7B, any one of the global regions as shown in FIG. 7A is divided into multiple segments and any one of the segments is divided into multiple subdomains. The assignable global redundant circuits in any segment are not crossed with the assignable global redundant circuits in other segments in the same global region, and the assignable local redundant circuits in any subdomain are not crossed with the assignable local redundant circuits in other subdomains in the same segment, the extension direction of each of the local redundant circuits is consistent with the extension direction BL of the bit lines, and the extension direction of each of the global redundant circuits is consistent with the extension direction WL of the word lines. In this way, the redundant circuit assigning method described in the above embodiments of the present disclosure can be achieved, thereby improving the utilization efficiency of the redundant circuits, avoiding repeated repair, and improving the yield of the semiconductor memory chip while reducing the repair cost on the premise of ensuring that all of the fail bits can be repaired.

As an example, in an embodiment of the present disclosure, the first test item includes a test item for electrical performance parameters, the second test item includes a test item for electrical performance parameters. The electrical performance parameters include at least one of surface resistance, surface resistivity, volume resistance, volume resistivity, or breakdown voltage.

It should be understood that while various steps in the flowcharts of FIGS. 1-6 are shown in sequence as indicated by arrows, the steps are not necessarily performed in sequence as indicated by arrows. Except where expressly stated herein, the execution of the steps is not strictly limited in sequence and the steps can be executed in other sequences. Moreover, although at least a portion of the steps in FIGS. 1-6 can include multiple sub-steps or multiple stages, the sub-steps or stages need not necessarily be performed at the same time but can be performed at different times, and the sub-steps or stages cannot necessarily be performed sequentially, rather, can be performed in turn or in alternation with at least a portion of other steps or sub-steps or stages of other steps.

Figure 8:
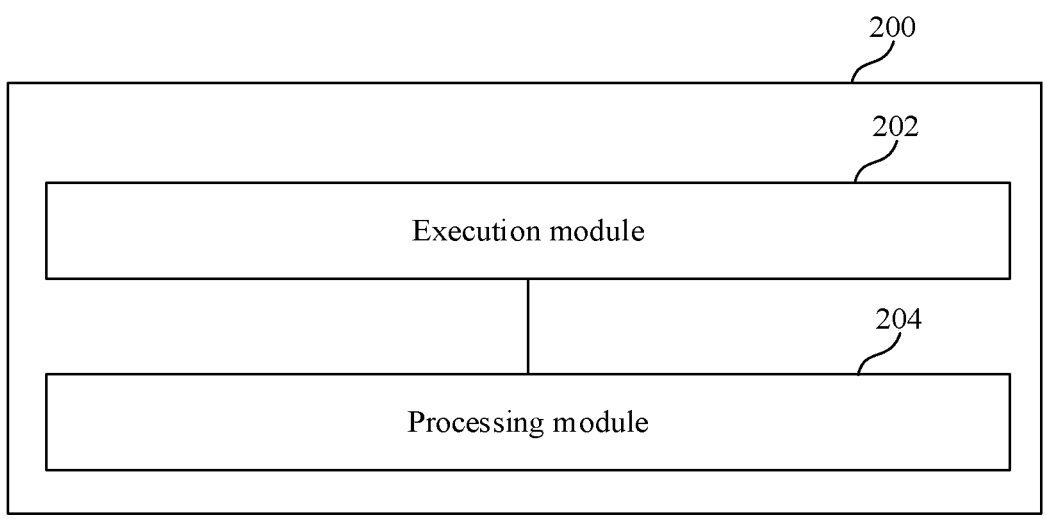
FIG. 8 is a structural block diagram of a redundant circuit assigning device according to an embodiment of the present disclosure.

Furthermore, referring to FIG. 8, in an embodiment of the disclosure, a redundant circuit assigning apparatus 200 is provided, which includes an execution module 202 and a processing module 204. The execution module 202 is configured to execute a first test item to acquire first test data, where the first test data includes position data of fail bits acquired during execution of the first test item; and the execution module is also configured to execute a second test item to acquire second test data, where the second test data includes position data of fail bits acquired during execution of the second test item. The processing module 204 is configured to determine a first redundant circuit assigning result according to the first test data, where the first redundant circuit assigning result includes the number of assigned local redundant circuits and position data corresponding to the assigned local redundant circuits. When the fail bits acquired during execution of the second test item include one or more fail bits beyond the repair range of the assigned local redundant circuits and the assigned global redundant circuits, and when the number of the assigned local redundant circuits is equal to the number of assignable local redundant circuits, the processing module determines a second redundant circuit assigning result according to the first test data and the second test data.

As an example, with further reference to FIG. 8, when the number of the assignable local redundant circuits and the number of the assignable global redundant circuits are both known, the execution module 202 executes the first test item to acquire the first test data, where the first test data includes position data of fail bits acquired during execution of the first test item, and then the first redundant circuit assigning result is determined according to the first test data, when the first redundant circuit assigning result includes the number of the assigned local redundant circuits and position data corresponding to the assigned local redundant circuits; the execution module 202 executes the second test item to acquire the second test data, where the second test data includes position data of fail bits acquired during execution of the second test item; and when the fail bits acquired during execution of the second test item include one or more fail bits beyond the repair range of assigned local redundant circuits and assigned global redundant circuits, and when the number of the assigned local redundant circuits is equal to the number of assignable local redundant circuits, the processing module 204 determines the second redundant circuit assigning result according to the first test data and the second test data. On the premise of ensuring that all the fail bits can be repaired by the assigned local redundant circuits and the assigned global redundant circuits, the sum of the number of the assigned local redundant circuits and the number of the assigned global redundant circuits is reduced as much as possible, the situation of repeated repair is avoided, and thus the utilization efficiency of the redundant circuits is improved.

Figure 9:
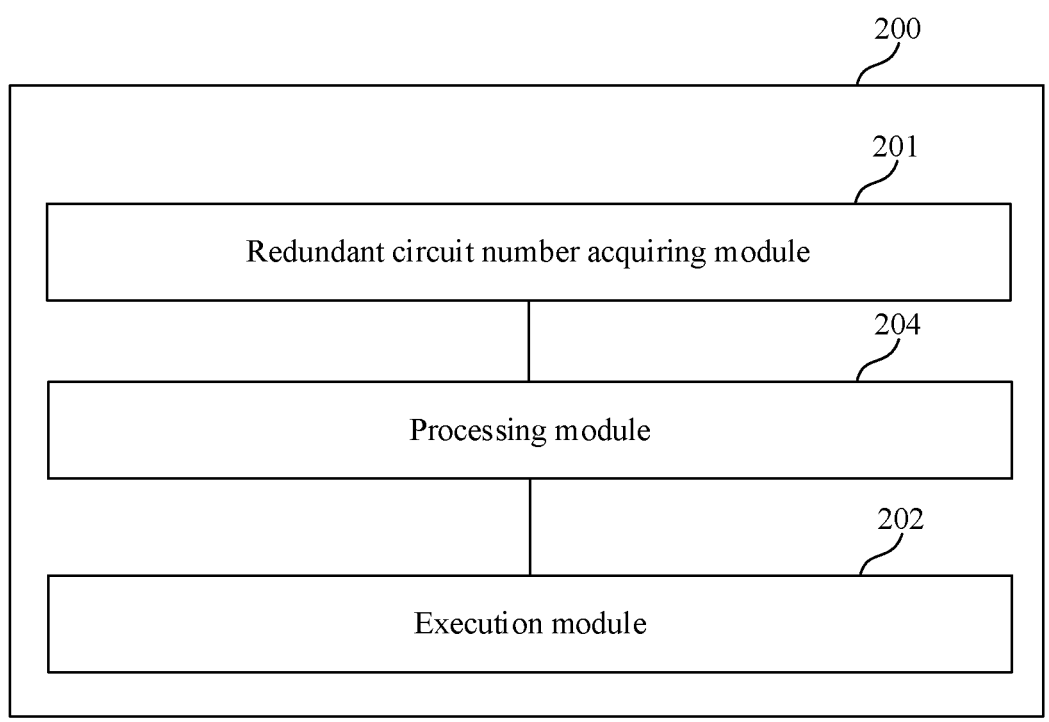
FIG. 9 is a structural block diagram of a redundant circuit assigning device according to another embodiment of the present disclosure.

Furthermore, referring to FIG. 9, in an embodiment of the disclosure, the redundant circuit assigning device 200 further includes a redundant circuit number acquiring module 201 configured to acquire a number of assignable local redundant circuits and a number of assignable global redundant circuits in a preset subdomain. Therefore, a preferable redundant circuit assigning scheme is determined according to the number of the assignable local redundant circuits and the number of assignable global redundant circuits. On the premise of ensuring that all fail bits can be repaired by the assigned local redundant circuits and the assigned global redundant circuits, the sum of the number of the assigned local redundant circuits and the number of the assigned global redundant circuits is reduced as much as possible, the situation of repeated repair is avoided, and thus the utilization efficiency of the redundant circuits is improved.

As an example, in an embodiment of the disclosure, an extension direction of the local redundant circuits is consistent with an extension direction of bit lines, an extension direction of the global redundant circuits is consistent with an extension direction of word lines, so that the local redundant circuits can repair the fail bits in the row direction in the memory cell array, and the global redundant circuits can repair the fail bits in the column direction in the memory cell array.

The various modules in the redundant circuit assigning apparatus described above can be implemented in whole or in part by software, hardware, and combinations thereof. The modules can be embedded in or independent of a processor in computer device in a hardware form, and can also be stored in a memory in the computer device in a software form, so that the processor can call and execute operations corresponding to the modules.

Figure 10:
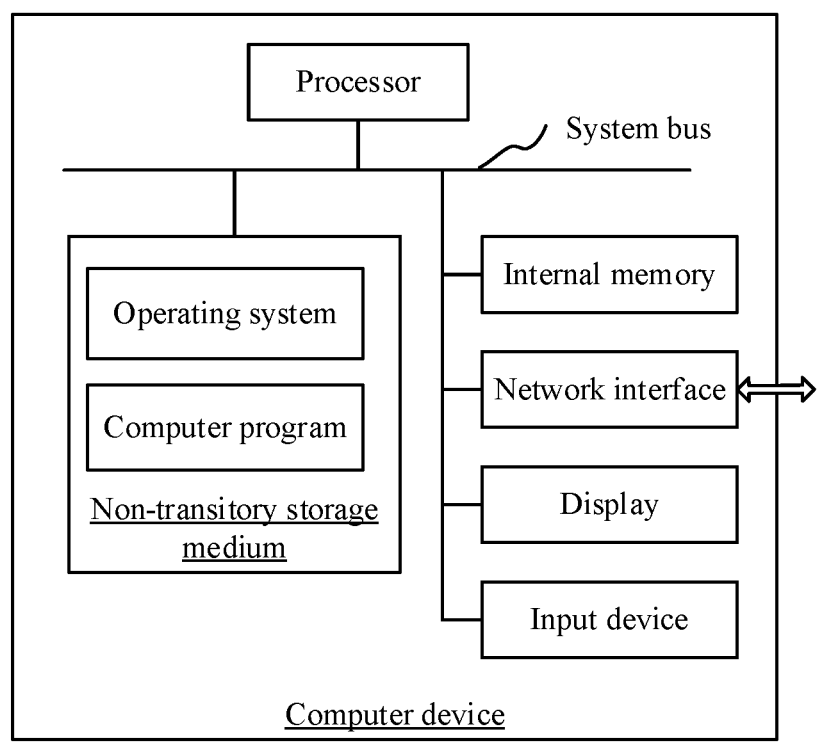
FIG. 10 is a schematic structural diagram of a computer device according to an embodiment of the present disclosure.

Furthermore, in an embodiment of the disclosure, a computer device, which can be a terminal, is provided, and the internal structural diagram of which can be shown in FIG. 10. The computer device includes a processor, a memory, a network interface, a display screen and an input device which are connected through a system bus. The processor of the computer device is configured to provide computation and control capabilities. The memory of the computer device includes a non-transitory storage medium, and an internal memory. The non-transitory storage medium stores an operating system and a computer program. The computer program, when executed by the processor, implements the redundant circuit assigning method. The display screen of the computer device can be a liquid crystal display screen or an electronic ink display screen, and the input device of the computer device can be a touch layer covering the display screen, can also be a key, a trackball or a touchpad arranged on a shell of the computer device, and can also be an external keyboard, a trackpad or a mouse and the like.

Those skilled in the art will appreciate that the structure shown in FIG. 10 is merely a block diagram of a portion of the structure related with the solution of the disclosure and does not constitute a limitation of the computer device to which the solution of the disclosure is applied, and that the particular computer device can include more or fewer components than shown, or combine certain components, or have a different arrangement of components.

In one embodiment of the present disclosure, a computer device that includes a memory, a processor, and a computer program stored on the memory and capable of running on the processor, where the processor implements the steps of a redundant circuit assigning method described in any embodiment of the present disclosure when executing the computer program.

In an embodiment of the disclosure, there is provided a computer-readable storage medium having stored thereon a computer program which, when executed by a processor, implements the steps of the redundant circuit assigning method as described in any one of the embodiments of the disclosure.

Those of ordinary skill in the art will appreciate that implementing all or part of the processes in the methods described above can be accomplished by instructing related hardware by a computer program, which can be stored in a non-transitory computer-readable storage medium, which, when executed, processes can be included as embodiments of the methods described above. Any reference to memory, storage, database, or other medium used in the various embodiments provided herein can include non-volatile and/or volatile memory. Non-volatile memory can include Read Only Memory (ROM), Programmable ROM (PROM), Electrically Programmable ROM (EPROM), Electrically Erasable Programmable ROM (EEPROM), or flash memory. Volatile memory can include Random Access Memory (RAM) or external cache memory. By way of illustration and not limitation, RAM is available in many forms such as Static RAM (SRAM), Dynamic RAM (DRAM), Synchronous DRAM (SDRAM), Double Data Rate SDRAM (DDRSDRAM), Enhanced SDRAM (ESDRAM), a Synch Link DRAM (SLDRAM), a Rambus Direct RAM (RDRAM), Direct Rambus Dynamic RAM (DRDRAM), and Rambus Dynamic RAM (RDRAM), among others.

The technical features of the above-described embodiments can be randomly combined, and not all possible combinations of the technical features in the above-described embodiments are described for simplicity of description, however, as long as the combinations of the technical features do not contradict each other, they should be considered to be within the scope of the description of the present specification.

The embodiments described above represent only several implementation modes of the disclosure, and the description thereof is specific and detailed, but should not be construed as limiting the scope of disclosure accordingly. It should be pointed out that those of ordinary skill in the art can also make some modifications and improvements without departing from the concept of the disclosure, and these modifications and improvements all fall within the scope of protection of the disclosure. Accordingly, the scope of the patent of the present application should be subject to the appended claims.

What is claimed is:

1. A redundant circuit assigning method, comprising:
acquiring a number of assignable local redundant circuits and a number of assignable global redundant circuits in a preset subdomain;
executing a first test item to obtain first test data, wherein the first test data comprises position data of fail bits acquired during execution of the first test item;
determining a first redundant circuit assigning result according to the first test data, wherein the first redundant circuit assigning result includes a number of assigned local redundant circuits and position data corresponding to the assigned local redundant circuits;
acquiring first accumulated fail bit position data, wherein the first accumulated fail bit position data comprises a sum of the position data of the fail bits acquired during execution of respective test items;
acquiring a first redundant circuit assigning accumulated result, wherein the first redundant circuit assigning accumulated result comprises: a sum of the numbers of assigned local redundant circuits and a sum of position data corresponding to the assigned local redundant circuits, after execution of respective test items; and a sum of numbers of assigned global redundant circuits and a sum of position data corresponding to the assigned global redundant circuits, after execution of respective test items;
executing a second test item to obtain second test data, wherein the second test data comprises position data of fail bits acquired during execution of the second test item;
acquiring second accumulated fail bit position data, wherein the second accumulated fail bit position data comprises a sum of the first accumulated fail bit position data and the position data of the fail bits acquired during the execution of the second test item; and
determining, in response to determining that the fail bits acquired during the execution of the second test item comprise one or more fail bits beyond a repair range of the assigned local redundant circuits and the assigned global redundant circuits, and in response to determining that the number of assigned local redundant circuits is equal to a number of assignable local redundant circuits, a second redundant circuit assigning result according to the first test data and the second test data,
wherein determining the second redundant circuit assigning result according to the first test data and the second test data comprises:
determining the second redundant circuit assigning result according to the second accumulated fail bit position data.

2. The method of claim 1, wherein:
an extension direction of the local redundant circuits is consistent with an extension direction of bit lines; and
an extension direction of the global redundant circuits is consistent with an extension direction of word lines.

3. The method of claim 1, further comprising: after determining the first redundant circuit assigning result according to the first test data and before executing the second test item to obtain the second test data,
acquiring a name of the first test item; and
generating a first accumulated fail bit location result, wherein the first accumulated fail bit location result comprises the name of the first test item and the first accumulated fail bit position data.

4. The method of claim 1, further comprising: after executing the second test item to obtain the second test data,
acquiring a name of the second test item; and
generating a second accumulated fail bit position result, wherein the second accumulated fail bit position result comprises the name of the second test item and the second accumulated fail bit position data.

5. The method of claim 1, further comprising: after executing the second test item to obtain the second test data,
determining whether each fail bit indicated by the second accumulated fail bit position data is covered by the repair range of the assigned local redundant circuits or the assigned global redundant circuits according to the second accumulated fail bit position data, the position data of the assigned local redundant circuits, and the position data of the assigned global redundant circuits; and
if each fail bit is covered, executing a third test item to obtain third test data.

6. The method of claim 1, wherein determining the second redundant circuit assigning result according to the first test data and the second test data further comprises:
withdrawing the assigned local redundant circuits and the assigned global redundant circuits, and determining the second redundant circuit assigning result according to the second accumulated fail bit position data; and
assigning local redundant circuits and global redundant circuits according to the second redundant circuit assigning result, so that each fail bit indicated by the second accumulated fail bit position data is covered by the repair range of the assigned local redundant circuits or the assigned global redundant circuits.

7. The method of claim 1, further comprising: before acquiring the number of assignable local redundant circuits and the number of assignable global redundant circuits in the preset sub-domain,
dividing a memory cell array bank of a memory into a plurality of global regions;
dividing any one of the global regions into a plurality of segments; and
dividing any one of the segments into a plurality of sub-domains;
wherein assignable global redundant circuits in any segment are not crossed with assignable global redundant circuits in other segments in a same global region, and assignable local redundant circuits in any sub-domain are not crossed with assignable local redundant circuits in other subdomains in a same segment.

8. The method of claim 1, wherein the first test item comprises a test item for electrical performance parameters;
the second test item comprises a test item for electrical performance parameters;

wherein the electrical performance parameters comprise at least one of surface resistance, surface resistivity, volume resistance, volume resistivity, or breakdown voltage.

9. A redundant circuit assigning device, comprising:
a memory storing processor-executable instructions; and
a processor configured to execute the stored processor-executable instructions to perform operations comprising:
acquiring a number of assignable local redundant circuits and a number of assignable global redundant circuits in a preset subdomain;
executing a first test item to obtain first test data, wherein the first test data comprises position data of fail bits acquired during execution of the first test item;
determining a first redundant circuit assigning result according to the first test data, wherein the first redundant circuit assigning result includes a number of assigned local redundant circuits and position data corresponding to the assigned local redundant circuits;
acquiring first accumulated fail bit position data, wherein the first accumulated fail bit position data comprises a sum of the position data of the fail bits acquired during execution of respective test items;
acquiring a first redundant circuit assigning accumulated result, wherein the first redundant circuit assigning accumulated result comprises: a sum of the numbers of assigned local redundant circuits and a sum of position data corresponding to the assigned local redundant circuits, after execution of respective test items; and a sum of numbers of assigned global redundant circuits and a sum of position data corresponding to the assigned global redundant circuits, after execution of respective test items;
executing a second test item to obtain second test data, wherein the second test data comprises position data of fail bits acquired during execution of the second test item;
acquiring second accumulated fail bit position data, wherein the second accumulated fail bit position data comprises a sum of the first accumulated fail bit position data and the position data of the fail bits acquired during the execution of the second test item; and
determining, in response to determining that the fail bits acquired during the execution of the second test item comprise one or more fail bits beyond a repair range of the assigned local redundant circuits and the assigned global redundant circuits, and in response to determining that the number of assigned local redundant circuits is equal to a number of assignable local redundant circuits, a second redundant circuit assigning result according to the first test data and the second test data,
wherein determining the second redundant circuit assigning result according to the first test data and the second test data comprises:
determining the second redundant circuit assigning result according to the second accumulated fail bit position data.

10. The device of claim 9, wherein
an extension direction of the local redundant circuits is consistent with an extension direction of bit lines; and
an extension direction of the global redundant circuits is consistent with an extension direction of word lines.

11. The device of claim 9, wherein the processor is configured to execute the stored processor-executable instructions to perform operations of: after determining the first redundant circuit assigning result according to the first test data and before executing the second test item to obtain the second test data,
acquiring a name of the first test item; and
generating a first accumulated fail bit location result, wherein the first accumulated fail bit location result comprises the name of the first test item and the first accumulated fail bit position data.

12. The device of claim 9, wherein the processor is configured to execute the stored processor-executable instructions to perform operations of: after executing the second test item to obtain the second test data,
acquiring a name of the second test item; and
generating a second accumulated fail bit position result, wherein the second accumulated fail bit position result comprises the name of the second test item and the second accumulated fail bit position data.

13. The device of claim 9, wherein the processor is configured to execute the stored processor-executable instructions to perform operations of: after executing the second test item to obtain the second test data,
determining whether each fail bit indicated by the second accumulated fail bit position data is covered by the repair range of the assigned local redundant circuits or the assigned global redundant circuits according to the second accumulated fail bit position data, the position data of the assigned local redundant circuits, and the position data of the assigned global redundant circuits; and
if each fail bit is covered, executing a third test item to obtain third test data.

14. A non-transitory computer-readable storage medium having stored thereon computer-executable instructions that, when executed by the processor, cause the processor to perform operations comprising:
acquiring a number of assignable local redundant circuits and a number of assignable global redundant circuits in a preset subdomain;
executing a first test item to obtain first test data, wherein the first test data comprises position data of fail bits acquired during execution of the first test item;
determining a first redundant circuit assigning result according to the first test data, wherein the first redundant circuit assigning result includes a number of assigned local redundant circuits and position data corresponding to the assigned local redundant circuits;
acquiring first accumulated fail bit position data, wherein the first accumulated fail bit position data comprises a sum of the position data of the fail bits acquired during execution of respective test items;
acquiring a first redundant circuit assigning accumulated result, wherein the first redundant circuit assigning accumulated result comprises: a sum of the numbers of assigned local redundant circuits and a sum of position data corresponding to the assigned local redundant circuits, after execution of respective test items; and a sum of numbers of assigned global redundant circuits and a sum of position data corresponding to the assigned global redundant circuits, after execution of respective test items;
executing a second test item to obtain second test data, wherein the second test data comprises position data of fail bits acquired during execution of the second test item;
acquiring second accumulated fail bit position data, wherein the second accumulated fail bit position data comprises a sum of the first accumulated fail bit position data and the position data of the fail bits acquired during the execution of the second test item; and determining, in response to determining that the fail bits acquired during the execution of the second test item comprise one or more fail bits beyond a repair range of the assigned local redundant circuits and the assigned global redundant circuits, and in response to determining that the number of assigned local redundant circuits is equal to a number of assignable local redundant circuits, a second redundant circuit assigning result according to the first test data and the second test data, wherein determining the second redundant circuit assigning result according to the first test data and the second test data comprises:

determining the second redundant circuit assigning result according to the second accumulated fail bit position data.

* * * * *